(12) United States Patent
Park

(10) Patent No.: US 7,049,230 B2
(45) Date of Patent: May 23, 2006

(54) METHOD OF FORMING A CONTACT PLUG IN A SEMICONDUCTOR DEVICE

(75) Inventor: Sung Eon Park, Seoul (KR)

(73) Assignee: Hynix Semiconductor Inc., Kyoungki-do (KR)

(*) Notice: Subject to any disclaimer, the term of this patent is extended or adjusted under 35 U.S.C. 154(b) by 38 days.

(21) Appl. No.: 10/984,494

(22) Filed: Nov. 9, 2004

(65) Prior Publication Data

US 2005/0112870 A1    May 26, 2005

(30) Foreign Application Priority Data

Nov. 26, 2003  (KR)  .................. 10-2003-0084311
Nov. 26, 2003  (KR)  .................. 10-2003-0084313

(51) Int. Cl.
*H01L 21/44* (2006.01)
(52) U.S. Cl. .................. 438/672; 438/660; 438/661; 438/675
(58) Field of Classification Search ........... 438/660, 438/661, 672, 675
See application file for complete search history.

(56) References Cited

U.S. PATENT DOCUMENTS 5,930,675 A * 7/1999 Hada .................. 438/647
6,844,259 B1 * 1/2005 Cheong ................ 438/657

* cited by examiner

*Primary Examiner*—George Pourson
*Assistant Examiner*—Fernando L. Toledo
(74) *Attorney, Agent, or Firm*—Ladas & Parry LLP

(57) ABSTRACT

A contact plug is formed in a semiconductor device having a silicon substrate having a gate electrode, a junction area and an insulating interlayer. A contact hole is formed to expose the junction area. A plasma process is carried out with respect to a resultant substrate, thereby removing natural oxides created on an exposed surface of the junction area. A first silicon layer is deposited on the contact hole and on the insulating interlayer. A heat-treatment process is carried out with respect to the first silicon layer so as to grow the amorphous silicon into the epitaxial silicon. A second silicon layer is deposited on the first silicon layer.

12 Claims, 4 Drawing Sheets

METHOD OF FORMING A CONTACT PLUG IN A SEMICONDUCTOR DEVICE

BACKGROUND OF THE INVENTION

1. Field of the Invention

The present invention relates generally to a method of forming a contact plug in a semiconductor device, and more particularly to a method of forming a contact plug in a semiconductor device that shortens heat-treatment time while minimizing degradation of the device characteristics due to high thermal budget.

2. Description of the Prior Art

With increasing miniaturization of semiconductor devices, diffusion control of dopants is an important factor for preventing the thermal stress related degradation of refresh and other transistor characteristics. For example, the typically short gate length in a micro-size semiconductor device requires implanting of excessive ions in order to obtain the desired threshold voltage. Excessively implanted ions cause gradual reduction of the refresh characteristics of the semiconductor device. The doped ions, such as phosphorous (or the phosphorous ions), are known to diffuse into the junction part or a cell transistor in a thermal process. This diffusion of doped phosphorous causes deterioration of the refresh characteristics of the semiconductor device.

The phosphorous are doped into a contact plug to obtain the effect of improving the refresh characteristics of the semiconductor device. In particular, the phosphorous is diffused into the polysilicon material of the contact plug, thereby lowering the doping effect. If the doping density of phosphorous is excessively lowered, the contact resistance would increase, which in turn would cause the current driving force of the semiconductor device to be significantly reduced. Thus, it is necessary to dope the phosphorous under well-designed process conditions that will prevent these types of problems and pitfalls.

One conventional method proposes forming a contact plug using epitaxial silicon as the plug material intended to obtain a superior interfacial property with reduced contact resistance even if the doping density of phosphorous is lowered.

In order to use the epitaxial silicon as the plug material, it is necessary to clean the surface of a substrate before the epitaxial silicon is grown. If defects, such as etching residues and natural oxides, exist between the surface of the substrate and the plug, the contact resistance may increase even if the epitaxial silicon is used for the plug, so it is difficult to obtain desired device characteristics.

The conventional pre-treatment process includes sequential performance of dry and wet cleaning processes and a hydrogen bake process (that is, a hydrogen heat-treatment process) under a high temperature condition above 800° C. Since the epitaxial silicon growth process is carried out at a temperature condition above 800° C., the thermal budget is considered high, causing degradation of the device characteristics.

Thermal budget generally refers to the total amount of thermal energy transferred to the semiconductor device during a given elevated temperature of operation. Therefore, the thermal budget is proportional to the temperature condition and the duration of the process done on the semiconductor device. Low thermal budget is generally desired in the manufacture of micro or smaller size semiconductor devices to prevent problems due to the dopant diffusion or dopant redistribution.

After the pre-treatment process of the surface, the solid phase epitaxy (SPE) method allows the growth of epitaxial silicon, according to which method amorphous silicon is first deposited on the wafer under a predetermined deposition temperature condition and then the deposited amorphous silicon is grown into epitaxial silicon through a following heat-treatment process.

This SPE method too has a problem that some part of the deposited amorphous silicon may be grown into epitaxial silicon, while leaving some other part of the amorphous silicon not affected or not grown (which results in a state of an interfacial surface), thereby causing a dual structure. The conventional technique of overcoming this problem requires very long (i.e., at least several hours) heat treatment process time under a temperature condition of 550 to 650 ° C. This will cause the amorphous silicon to be crystallized as the epitaxial silicon. Obviously, such a requirement of long heat-treatment process time reduces the productivity of the semiconductor devices.

Even though the SPE method may appear to help attenuating the high thermal budget problem by utilizing the temperature condition of 550 to 650° C. during the epitaxial silicon growth process, the SPE method still cannot alleviate the high thermal budget problems caused by the high temperature condition in the pre-treatment process, such as the hydrogen heat-treatment process requiring the temperature condition above 800° C.

SUMMARY OF THE INVENTION

Accordingly, the present invention has been made to solve the above-mentioned and other related problems occurring in the prior art. One object of the present invention is to provide an SPE method capable of forming a contact plug of a semiconductor device while shortening a heat-treatment time.

Another object of the present invention is to provide a method for forming a contact plug of a semiconductor device capable of minimizing degradation of a device characteristic caused by a hydrogen heat-treatment process.

In order to accomplish the object, there is provided a method for forming a contact plug of a semiconductor device, the method comprising the steps of: preparing a silicon substrate having a gate electrode, a junction area and an insulating interlayer, which is formed on an entire surface of the silicon substrate in order to cover the gate electrode and the junction area; forming a contact hole for exposing the junction area by etching the insulating interlayer; performing dry and wet cleaning processes with respect to an exposed surface of the junction area; performing a plasma process with respect to a resultant substrate, thereby removing natural oxides created on the exposed surface of the junction area; depositing a first silicon layer on upper portions of the contact hole and the insulating interlayer such that the contact hole is not completely filled with the first silicon layer, the first silicon layer including epitaxial silicon at a lower portion thereof, amorphous silicon at an upper portion thereof and polycrystalline silicon on the insulating interlayer; applying heat to the first silicon layer so as to grow the amorphous silicon into the epitaxial silicon; depositing a second silicon layer on the first silicon layer, the second silicon layer having a structure identical to a structure of the first silicon layer; and performing a CMP process with respect to the first and second silicon layers so as to expose the insulating interlayer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Generally, epitaxial silicon is used to make a contact plug in a semiconductor memory device to obtain a low contact resistance at a relatively low doping density. The lowered doping density allows small dopant diffusion.

According to an embodiment of the present invention, a hydrogen heat-treatment process, which is the conventional pre-treatment process requiring high temperature condition above 800° C., is replaced with a plasma treatment process requiring lower temperature condition, about 600° C. or lower. This lowers the thermal budget during the pre-treatment process and help to prevebt the device characteristic degradation.

Further according to an embodiment of the present invention particularly with respect to the SPE method of growing the epitaxial silicon, the amorphous silicon is deposited on the wafer in multiple deposition steps, i.e., at least more than two steps. A subsequent heat-treatment process allows the deposited amorphous silicon to be grown into the epitaxial silicon. This aspect of the present invention (explained in more detail below) allows, inter alia, thin or thinner epitaxial silicon in comparison to that obtained by the conventional method, resulting in significant reduction of heat treatment time for growing the amorphous silicon into the epitaxial silicon.

Hereinafter, a method for forming a contact plug of a semiconductor device according to one embodiment of the present invention will be described in detail with reference to FIGS. 1A to 1G.

Figure 1A:
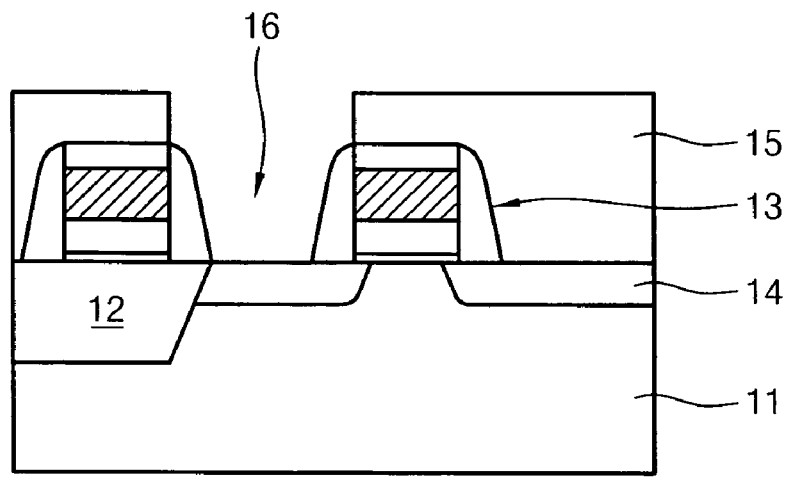
FIGS. 1A to 1G are sectional views for explaining a method for forming a contact plug in a semiconductor device according to one embodiment of the present invention.

Referring to FIG. 1A, an isolation layer 12, a gate electrode 13 and a junction area 14 are formed on a silicon substrate 11 as shown in FIG. 1A. The gate electrode 13 has the stacked structure of a gate oxide layer, a gate conductive layer and a hard mask layer (all of which are shown on FIG. 1A but not labeled with specific reference numerals). A spacer (again shown but not labeled) is formed at both sidewalls of the gate electrode 13. An insulating interlayer 15 is formed on the surface of the silicon substrate 11 covering the gate electrode 13. Then, a portion of the insulating interlayer 15 is etched to form a contact hole 16 exposing the junction area 14 as shown in FIG. 1A. The contact hole 16 is a landing plug contact hole for forming bit line contact or a storage node contact in the structure as shown in FIG. 1A, but other comparable structures are also possible.

Figure 1B:
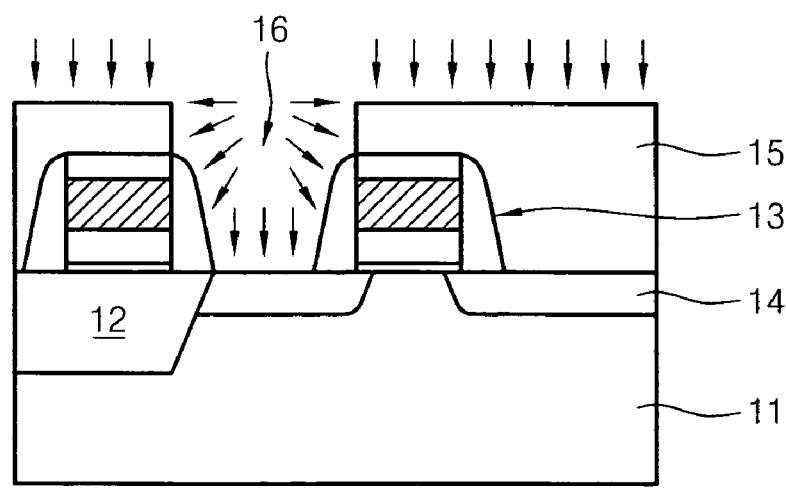

Referring to FIG. 1B, dry and wet cleaning processes (symbolically shown with arrows in FIG. 1B) preferably in that process order but not necessarily required are performed on the resultant substrate, and this removes the residual oxides or etching residues, especially from the junction area 14 exposed by the contact hole 16.

Figure 1C:
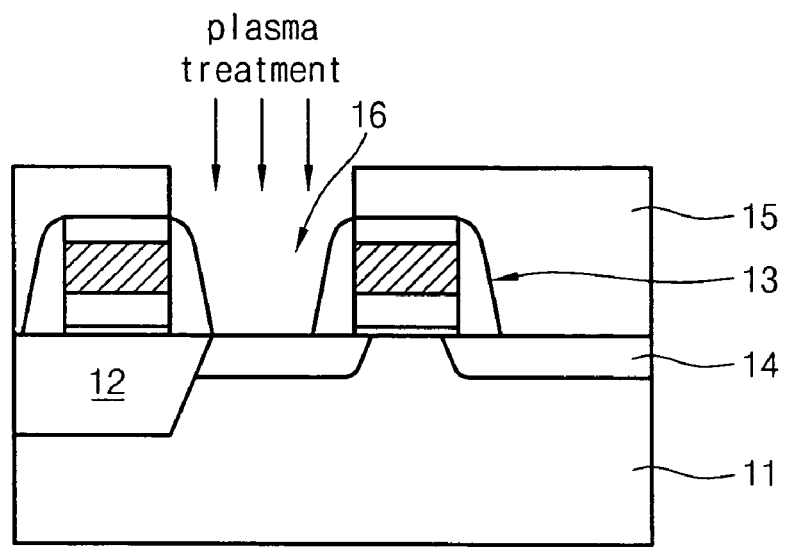

Referring to FIG. 1C, the exposed surface of the junction area 14 is heat-treated to remove the natural oxide layer that may remain on the surface of the junction area 14. This heat-treatment process is a plasma process, which is carried out under the temperature condition of 200 to 600° C., and the pressure condition of a few mTorr to a few Torr (such as in the range of 1 mTorr and 9 Torr) while supplying the mixture of hydrogen and nitrogen gases to the resultant substrate loaded in a reactor. The flow rates of hydrogen gas is 20 to 500 sccm, and the flow rate of the nitrogen gas is 0 to 2000 sccm. In addition, the microwave in the magnitude of 500 to 2000 W is applied to the reactor, and a substrate bias voltage of lower than 20 V is applied in order to prevent the silicon substrate from being damaged.

Plasma can be generated in a plasma process carried out with only the hydrogen gas. However, it is more effective to carry out the plasma process with a mixture of hydrogen and nitrogen gases, because it will generate higher-density plasma while providing the cleaning efficiency comparable to that of the hydrogen plasma process.

Generally, the hydrogen heat-treatment process requires high temperature above 800° C., so there is a limitation for reducing the thermal budget. In contrast, the plasma process according to the present invention can be carried out under the temperature condition of about 200 to 600° C. by using the mixture of hydrogen and nitrogen gases, thereby reducing the thermal budget during the pre-treatment and minimizing degradation of the device characteristic caused by high thermal budget.

Figure 1D:
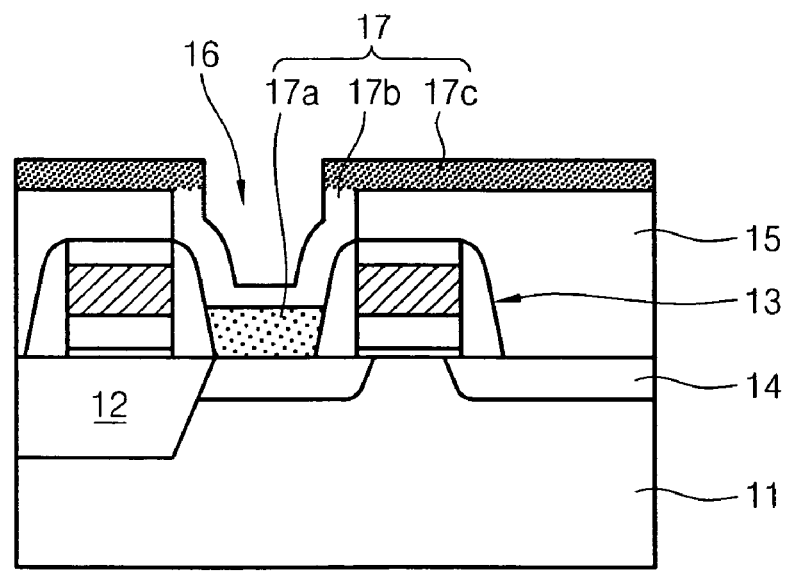

Referring to FIG. 1D, the resultant structure of FIG. 1C is moved into a silicon deposition chamber in a vacuum state. Then, a first silicon layer 17 is deposited on the contact hole 16 and the insulating interlayer 15. For the deposition of the first silicon layer 17, DCS (dichlorosilane: $SiCl_2H_2$) is used as the source gas, $H_2$ is used as the reaction gas, and $PH_3$ is used as the dopant gas. The deposition of the first silicon layer 17 would not completely fill the contact hole 16. The first silicon layer 17 is deposited to a thickness of about 200 to 1500 Å at the temperature condition of about 530 to 650° C. The flow rate of the dopant gas ($PH_3$) is adjusted in the range of about 0 to 500 sccm in order to obtain the desired doping density.

During the deposition of the first silicon layer 17, an epitaxial silicon 17a is grown on the surface of the junction area 14. The epitaxial silicon 17a is continuously grown while the heat is applied. When the epitaxial silicon 17a has grown to more than a predetermined thickness of about 100 to 1000 Å, an amorphous silicon 17b is also formed. The first silicon layer 17 deposited on the insulating layer 15 is grown into a polycrystalline silicon 17c.

Figure 1E:
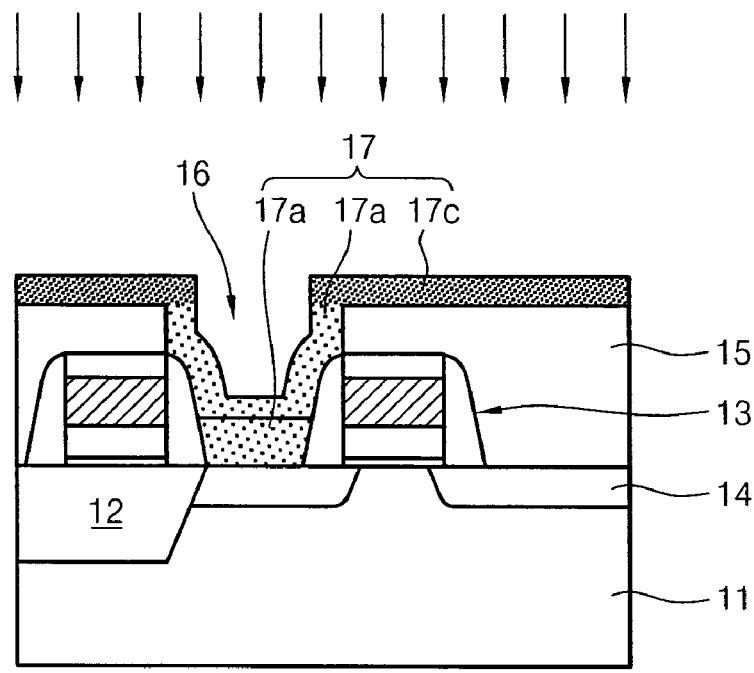

Referring to FIG. 1E, the first silicon layer 17 (i.e., 17a, 17b, 17c) is subjected to a heat-treatment process under the hydrogen atmosphere for 2 to 30 minutes at the temperature condition of 550 to 650° C. in-situ. This causes the amorphous silicon 17b to crystallize and join into the epitaxial silicon 17a. Therefore, 17b of FIG. 1D is renumbered to 17a in FIG. 1E.

Figure 1F:
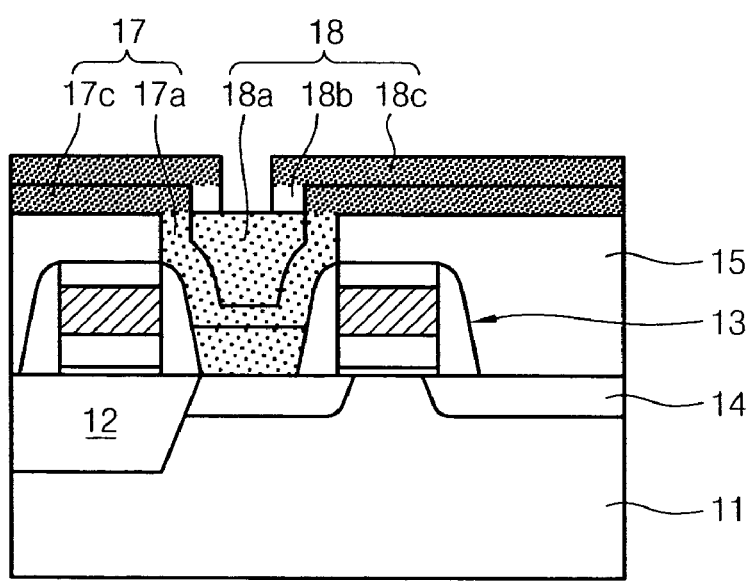

Referring to FIG. 1F, a second silicon layer 18 is deposited on the first silicon layer 17 under the process condition similar to the above mentioned process condition. The lower portion of the second silicon layer 18 is grown into an epitaxial silicon 18a and the upper portion of the second silicon layer 18 is grown into amorphous silicon 18b. A polycrystalline silicon 18c is grown on the polycrystalline silicon layer 17c of the first silicon layer 17.

Figure 1G:
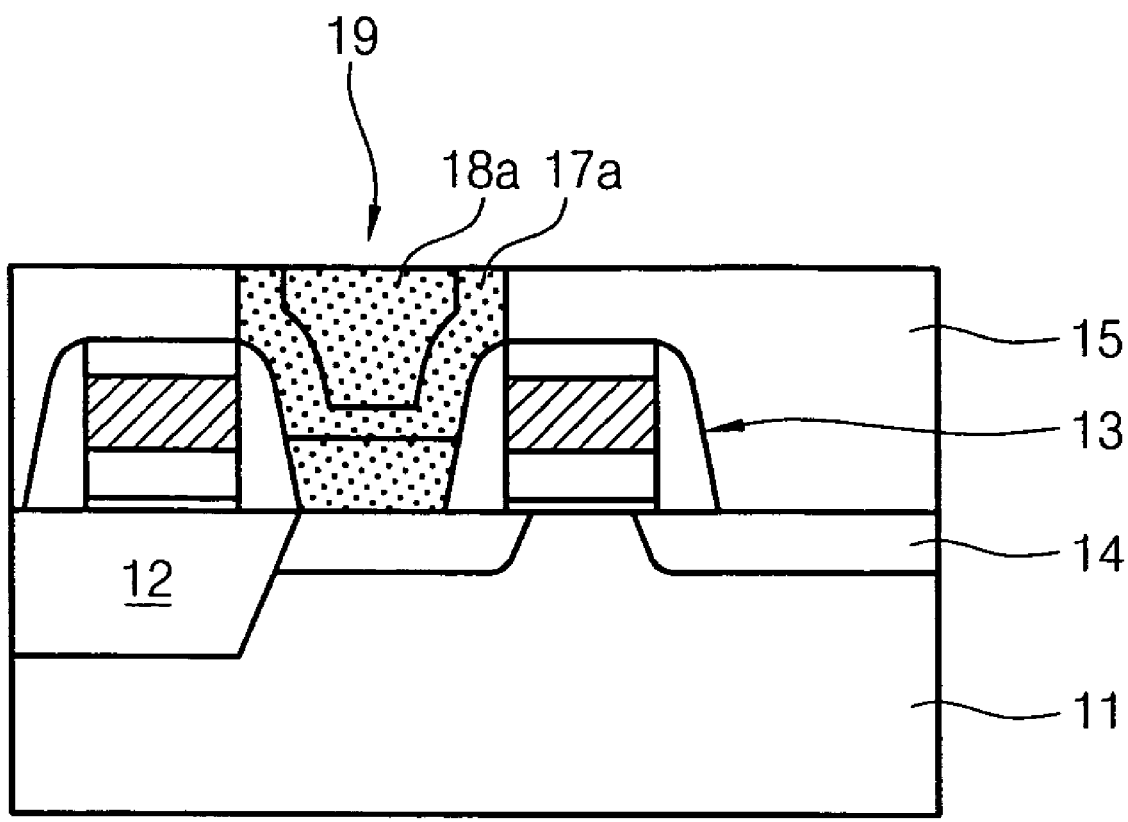

Referring to FIG. 1G, the second silicon layer 18 (i.e., 18a, 18b, 18c) and the first silicon layer 17 (i.e., 17a, 17c) are subjected to the CMP or etch-back process and exposes the insulating interlayer 15. As shown in FIG. 1G, a contact plug 19 having the epitaxial silicon layers 17a and 18a are formed in the contact hole 16.

In a conventional SPE method, rather thick amorphous silicon is deposited to completely fill a contact hole, and a heat-treatment process is thereafter carried out to grow the amorphous silicon into epitaxial silicon. This requires longer heat-treatment process time. However, according to the present invention, the first silicon layer (such as FIG. 1D, 17) including amorphous silicon (such as 17b) is deposited on the wafer without completely filling the contact hole with the first silicon layer. The heat-treatment process is carried out with respect to the first silicon layer in order to grow the amorphous silicon into epitaxial silicon. After that, the second silicon layer (such as FIG. 1F, 18) is deposited on the first silicon layer. Thus, the present invention significantly reduces the heat-treatment time required for crystallizing the amorphous silicon into the epitaxial silicon.

According to another embodiment of the present invention, single amorphous silicon is deposited on a wafer and an in-situ heat-treatment process is carried out with respect to the single amorphous silicon without using a double-layered silicon structure. In this case, the heat-treatment time can be reduced while allowing epitaxial silicon to grow from a bottom of a contact hole, thereby improving a contact characteristic.

As described above, according to an embodiment of the present invention, a contact plug made from epitaxial silicon is formed through an SPE method. A first silicon layer including epitaxial silicon and amorphous silicon is primarily deposited on a wafer to a thickness and a heat-treatment process is carried out with respect to the first silicon layer for a short period of time, thereby growing the amorphous silicon into the epitaxial silicon.

After that, a second silicon layer including epitaxial silicon and amorphous silicon is secondarily deposited on the first silicon layer, thereby forming the contact plug. Therefore, a thickness of amorphous silicon to be crystallized becomes reduced, so the heat-treatment time can be significantly reduced. Accordingly, the present invention does not require a long time heat-treatment process, so productivity of semiconductor devices may improve.

In addition, according to the present invention, a plasma process is carried out as a pre-treatment process for removing natural oxides. Thus, the thermal budget can be attenuated, so that the device characteristic can be improved.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. In a semiconductor device having a silicon substrate having a gate electrode, a junction area, and an insulating interlayer, wherein a contact hole exposing the junction area is formed in a portion of the insulating interlayer, a method of forming a contact plug in the contact hole comprising the steps of:
   i) performing a plasma process removing natural oxides on the exposed surface of the junction area;
   ii) depositing a first silicon layer in the contact hole without completely filling the contact hole and on the insulating interlayer, wherein the first silicon layer includes epitaxial silicon in the lower portion of the contact hole, amorphous silicon in the portion above the lower portion of the contact hole, and polycrystalline silicon on the insulating interlayer;
   iii) applying heat to the first silicon layer transforming the amorphous silicon into epitaxial silicon in the portion above the lower portion of the contact hole;
   iv) depositing a second silicon layer on the first silicon layer; and
   v) performing a CMP process with respect to the first and second silicon layers so as to expose the insulating interlayer.

2. The method of claim 1, wherein the plasma process is performed under a temperature condition of 200 to 600° C. and a pressure condition of 1 mTorr to 9 Torr while supplying hydrogen and nitrogen gases.

3. The method of claim 2, wherein the flow rate of hydrogen gas is in the range of 20 and 500 sccm, and the flow rate of nitrogen gas is in the range of 0 and 2000 sccm.

4. The method of claim 1, wherein the plasma process is performed in presence of 500 to 2000 W of microwave and a substrate bias voltage of lower than 20 V.

5. The method of claim 1, wherein the first and second silicon layers are deposited by using a dichlorosilane (DCS) gas, a $H_2$ gas, and a $PH_3$ gas under a temperature condition of 530 to 650° C.

6. The method of claim 5, wherein the flow rate of the $PH_3$ gas is in a range of about 0 to 500 sccm.

7. The method of claim 1, wherein the first silicon layer is deposited to a thickness of about 200 to 1500 Å.

8. The method of claim 1, wherein the epitaxial silicon of the first silicon layer is grown to a thickness of about 100 to 1000 Å.

9. The method of claim 1 further comprising performing a heat-treatment process carried out for the first silicon layer under a hydrogen atmosphere for 2 to 30 minutes at a temperature condition of 550 to 650° C.

10. The method of claim 1 further comprising performing a heat-treatment process carried out for the first silicon layer in-situ during the deposition of the first silicon layer.

11. The method of claim 1, further comprising performing dry and wet cleaning processes on the exposed junction area in the contact hole before performing the plasma process.

12. The method of claim 1, wherein the structures of the first and second silicon layers are substantially identical.

* * * * *